(12) United States Patent
Lin et al.

(10) Patent No.: US 11,668,639 B2
(45) Date of Patent: Jun. 6, 2023

(54) METHOD FOR PROCESSING A SUBSTRATE BY USING FLUID FLOWING THROUGH A PARTICLE DETECTOR

(71) Applicant: Taiwan Semiconductor Manufacturing Company, Ltd., Hsinchu (TW)

(72) Inventors: En-Tian Lin, Hsinchu (TW); Chwen Yu, Taipei (TW); Mei Lee, Hsinchu (TW); Shu-Yu Hsu, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 117 days.

(21) Appl. No.: 17/228,656

(22) Filed: Apr. 12, 2021

(65) Prior Publication Data

US 2021/0231553 A1    Jul. 29, 2021

Related U.S. Application Data

(63) Continuation of application No. 16/103,934, filed on Aug. 15, 2018, now Pat. No. 10,976,233.

(51) Int. Cl.
*G01R 1/04* (2006.01)
*G01R 1/067* (2006.01)
(Continued)

(52) U.S. Cl.
CPC ... *G01N 15/1227* (2013.01); *H01L 21/67023* (2013.01); *G01N 2015/0038* (2013.01); *G01N 2015/1254* (2013.01)

(58) Field of Classification Search
CPC .......... G01R 1/04; G01R 1/067; G01R 1/073; G01N 15/10; G01N 15/12; G01N 27/00;
(Continued)

(56) References Cited

U.S. PATENT DOCUMENTS

| 7,410,564 B2* | 8/2008 | Flory | B82Y 30/00 |
| | | | 204/403.01 |
| 9,250,202 B2* | 2/2016 | Chun | G01N 27/00 |

(Continued)

FOREIGN PATENT DOCUMENTS

| CN | 103328973 | 9/2013 |
| JP | 2004233356 | 8/2004 |
| KR | 20120133653 | 12/2012 |

OTHER PUBLICATIONS

"Office Action of China Counterpart Application", dated Oct. 9, 2021, p. 1-p. 15.

*Primary Examiner* — Neel D Shah
(74) *Attorney, Agent, or Firm* — JCIPRNET

(57) ABSTRACT

A method for processing a substrate by using fluid flowing through a particle detector is provided. The particle detector is utilized to detect nano-particles contained in fluid. The particle detector includes a substrate and a pair of sensing electrodes disposed on the substrate. The substrate includes nano-pores, wherein the pore size of the nano-pores is greater than the particle size of the nano-particles, allowing the nano-particles contained in the fluid passing through the nano-pores. The pair of sensing electrodes are positioned adjacent to at least one of the nano-pores.

20 Claims, 19 Drawing Sheets

(51) Int. Cl.
*G01R 1/073* (2006.01)
*G01N 15/10* (2006.01)
*G01N 15/12* (2006.01)
*G01N 27/00* (2006.01)
*G01N 33/28* (2006.01)
*G01N 21/00* (2006.01)
*H01L 21/67* (2006.01)
*G01N 15/00* (2006.01)

(58) Field of Classification Search
CPC .... G01N 27/26; G01N 27/453; G01N 27/447; G01N 33/28; G01N 33/487; G01N 33/50; G01N 21/00; H01L 21/67
See application file for complete search history.

(56) References Cited

U.S. PATENT DOCUMENTS

| | | | |
|---|---|---|---|
| 2011/0050200 A1* | 3/2011 | Tartagni | G01N 15/1056 324/71.4 |
| 2012/0037919 A1 | 2/2012 | Xu et al. | |
| 2012/0097539 A1 | 4/2012 | Qian et al. | |

* cited by examiner

METHOD FOR PROCESSING A SUBSTRATE BY USING FLUID FLOWING THROUGH A PARTICLE DETECTOR

CROSS-REFERENCE TO RELATED APPLICATION

This is a continuation application of and claims the priority benefit of U.S. application Ser. No. 16/103,934, filed on Aug. 15, 2018, now allowed. The entirety of the above-mentioned patent applications is hereby incorporated by reference herein and made a part of this specification.

BACKGROUND

Nowadays, ultra-pure water (UPW) is widely utilized in the fabrication process of wafers and cleaning process for reticles (photo-masks). For future advance semiconductor processes, nano-particles contained in ultra-pure water may contaminate wafers or reticles (photo-masks) and cause yield rate loss. Currently, there is no real time monitoring technique for detecting nano-particles in ultra-pure water.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
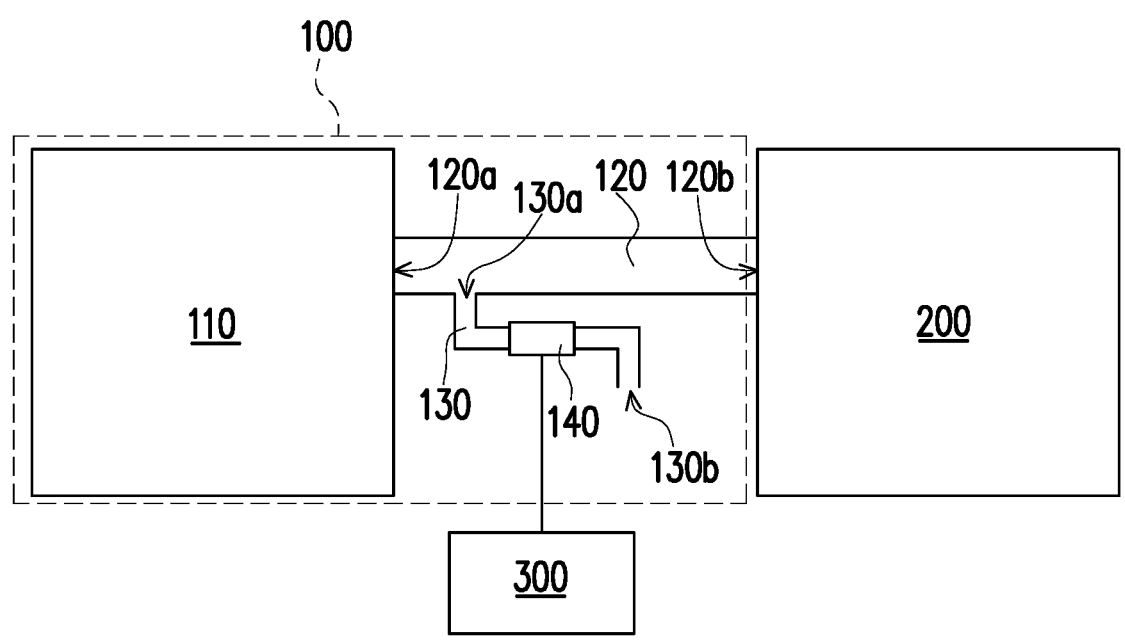
FIG. 1 schematically illustrates a process equipment in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 schematically illustrates a process equipment in accordance with some embodiments of the present disclosure. Referring to FIG. 1, the process equipment in accordance with some embodiments of the present disclosure may include a fluid supplying apparatus 100, a process chamber 200 physically connected to the fluid supplying apparatus 100, and a control circuit 300 electrically connected to the fluid supplying apparatus 100. In some embodiments, the fluid supplying apparatus 100 may include a supplying system 110, a delivery pipe 120, a sampling pipe 130 and a particle detector 140. For example, the supplying system 110 may be a supplying system capable of supplying ultra-pure water (UPW) or a supplying system capable of supplying other liquidus fluid (e.g., chemical solution) or gaseous fluid (e.g., chemical gas). The delivery pipe 120 is physically connected between the supplying system 110 and the process chamber 200 such that the fluid (e.g., ultra-pure water or chemical solution) may be delivered from the supplying system 110 to the process chamber 200 through the delivery pipe 120. The sampling pipe 130 is physically connected to the delivery pipe 120 and the particle detector 140 is installed in the sampling pipe 130. To monitor the quality of the fluid delivered by the delivery pipe 120, the sampling pipe 130 introduces a portion of the fluid delivered in the delivery pipe 120 to the particle detector 140 such that the portion of the fluid introduced and delivered in the sampling pipe 130 may flow through the particle detector 140. When the portion of the fluid introduced and delivered in the delivery pipe 120 flows through the particle detector 140, the particle detector 140 may detect and/or count nano-particles contained in the fluid so as to monitor the quality of the fluid delivered in the delivery pipe 120.

In some embodiments, the particle detector 140 may be a replaceable component capable of being detached from the sampling pipe 130 easily.

As shown in FIG. 1, in some embodiments, the delivery pipe 120 may include a delivery inlet 120a connected to the supplying system 110 and a delivery outlet 120b connected to the process chamber 200, and the sampling pipe 130 may include a sampling inlet 130a connected to the delivery pipe 120 and a sampling outlet 130b connected to drain. The sampling inlet 130a is connected to a middle section of the delivery pipe 120 and the middle section of the delivery pipe 120 is between the delivery inlet 120a and the delivery outlet 120b. The particle detector 140 is embedded in a middle section of the sampling pipe 130 and the middle section of the sampling pipe 130 is between the sampling inlet 130a and the sampling outlet 130b.

In some embodiments, the process chamber 200 may be a cleaning chamber for wafer cleaning, substrate cleaning, and/or reticles (photo-masks) cleaning. However, the function of the process chamber 200 is not limited in the present invention. In some alternative embodiments, other suitable process (e.g., etching process, thermal process or oxidation process) may be performed in the process chamber 200.

As shown in FIG. 1, the control circuit 300 is electrically connected to the particle detector 140. When the fluid introduced and delivered in the delivery pipe 120 flow through the particle detector 140, nano-particles contained in the fluid may be detected and/or count by the particle detector 140 and detection and/or counting signal is generated from the particle detector 140. The particle detector 140 may not only detect existence of nano-particles, but also may serve as a particle counter to monitor and estimate the number of nano-particles passing through the particle detector 140. The detection and/or counting signal generated from the particle detector 140 is transmitted to and processed by the control circuit 300. In some embodiments, the control circuit 300 may include a Volt-meter (i.e. voltage meter), an Am-meter (i.e. current meter), an Ohm-meter (i.e. resistor meter), a capacitance meter, and/or a Volt-Ohm meter (i.e. multi-meter).

In some embodiments, a flowmeter (not shown) may be implemented such that the flowrate of the fluid delivered in the sampling pipe 130 and the concentration of nano-particles contained in the fluid may be monitored and estimated.

Figure 2:
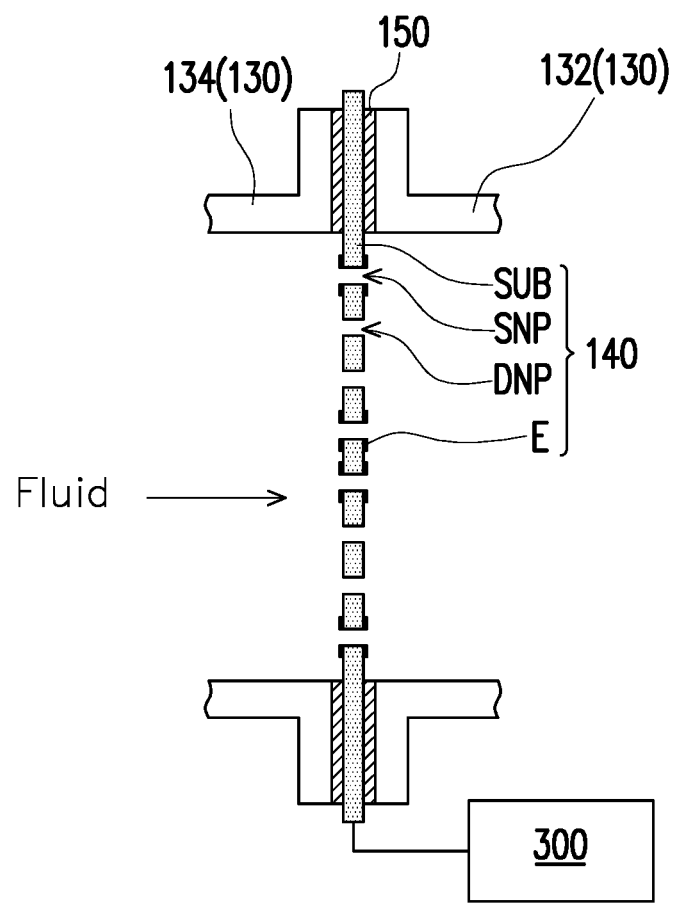
FIG. 2 is a cross-sectional view schematically illustrating the particle detector in accordance with some embodiments of the present disclosure.
Figure 3:
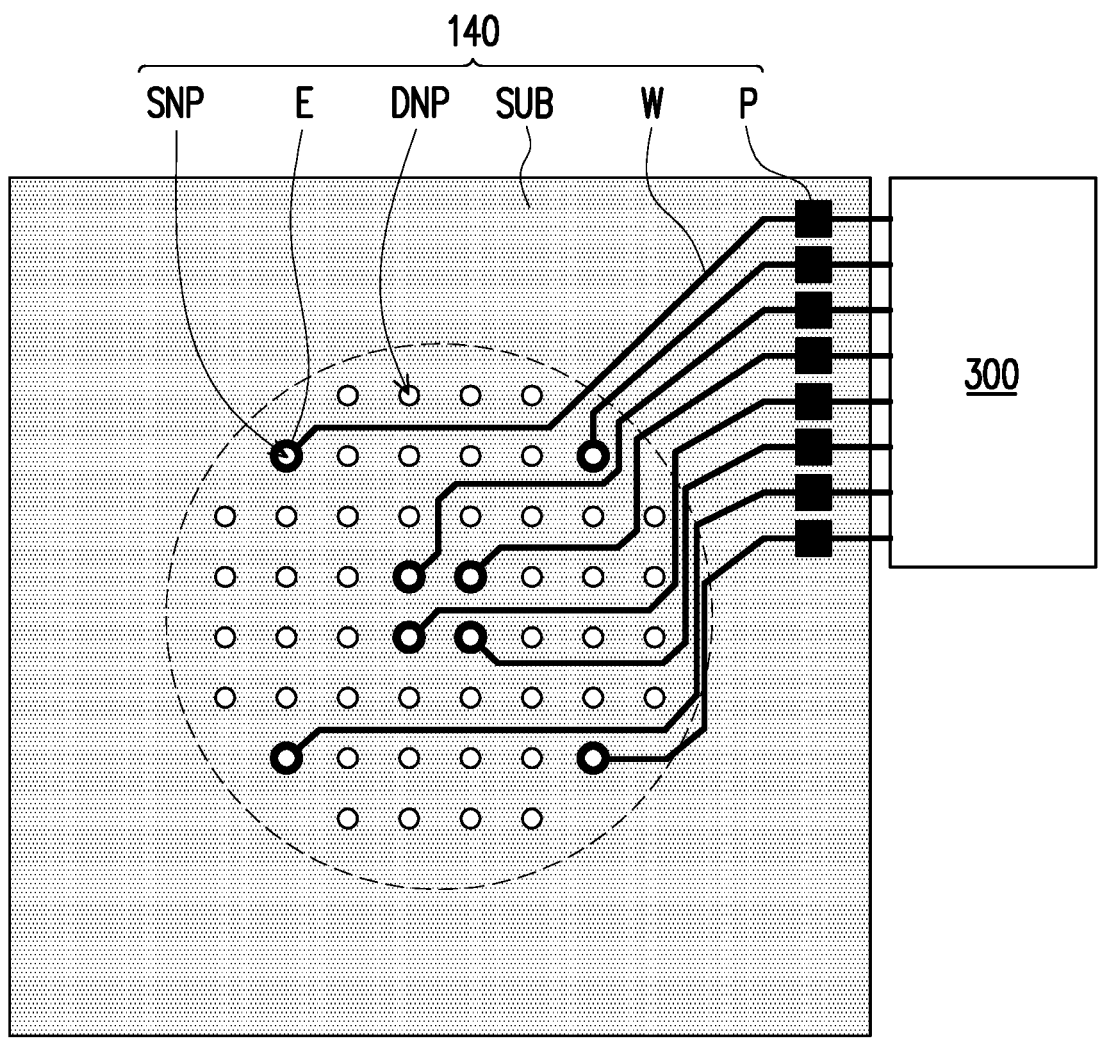
FIG. 3 is a plane view of the particle detector in accordance with some embodiments of the present disclosure.

FIG. 2 is a cross-sectional view schematically illustrating the particle detector in accordance with some embodiments of the present disclosure; and FIG. 3 is a plane view of the particle detector in accordance with some embodiments of the present disclosure.

Referring to FIG. 2, the particle detector 140 may be embedded in and assembled with the sampling pipe 130. In some embodiments, the sampling pipe 130 may include a plurality of sectional pipes (e.g., a sectional pipe 132 and a sectional pipe 134 adjacent to the sectional pipe 134) and the particle detector 140 may be sandwiched between the two adjacent sectional pipes 133 and 134. To facilitate the assembling of the sampling pipe 130 and the particle detector 140, a plurality of elastic elements 150 may be utilized. For example, two elastic elements 150 are installed on two opposite surfaces of the particle detector 140 such that the elastic elements 150 and the particle detector 140 may be clamped by the sectional pipe 132 and the sectional pipe 134. The elastic elements 150 may serve as dampers between the sampling pipe 130 and the particle detector 140 so as to prevent the particle detector 140 from being damaged by the sampling pipe 130. Furthermore, the elastic elements 150 may seal the gap between the sectional pipe 132 and the particle detector 140 as well as the gap between the sectional pipe 134 and the particle detector 140 so as to prevent the fluid from leaking. In some embodiments, the elastic elements 150 may be two O-rings sandwiched between the sectional pipe 132 and the particle detector 140 as well as the sectional pipe 134 and the particle detector 140. In addition, the material of the elastic elements 150 may be rubber or other suitable elastic material.

As shown in FIG. 2 and FIG. 3, in some embodiments, the particle detector 140 may include a substrate SUB and a plurality of pairs of sensing electrodes E disposed on the substrate SUB. The substrate SUB may include a plurality of sensing nano-pores SNP and a plurality of dummy nano-pores DNP distributed therein, wherein the pore size of the sensing nano-pores SNP and the dummy nano-pores DNP is greater than the particle size of the nano-particles, allowing the nano-particles contained in the fluid passing through the sensing nano-pores SNP and the dummy nano-pores DNP. In some embodiments, the substrate SUB may be a semiconductor substrate (e.g., silicon substrate), and the sensing nano-pores SNP and the dummy nano-pores DNP distributed in the substrate SUB may be fabricated through photolithography and etch processes, for example. The pairs of sensing electrodes E are disposed on the substrate SUB. Each pair of sensing electrodes E is located adjacent to or around one of the sensing nano-pores SNP, respectively. As shown in FIG. 2 and FIG. 3, no sensing electrode is located adjacent to or around the dummy nano-pores DNP. The dummy nano-pores DNP may allow sufficient amount of fluid passing through the substrate SUB such that the flowrate of the fluid delivered in the sampling pipe 130 may be maintained at a certain level. Since the dummy nano-pores DNP allows sufficient amount of fluid passing through the substrate SUB, the sampling rate is representative. Furthermore, since the flowrate of the fluid delivered in the sampling pipe 130 is less than the flowrate of the fluid delivered in delivery pipe 120, the particle detector 140 may bear the pressure differential across the sensing nano-pores SNP and the dummy nano-pores DNP. In the present embodiment, the sensing nano-pores SNP and the dummy nano-pores DNP may be substantially identical in pore size. In some alternative embodiments, not shown in the drawings, the sensing nano-pores SNP and the dummy nano-pores DNP may be different in pore size. For example, the pore size of the sensing nano-pores SNP may be between about 5 nanometers to about 200 nanometers and the pore size of the dummy nano-pores DNP may be between about 5 nanometers to about 200 nanometers. The pore size of the sensing nano-pores SNP may be determined in accordance with the particle size of the nano-particles to be detected. For example, the particle size of the nano-particles to be detected is about 20 nanometers when the pore size of the sensing nano-pores SNP is about 100 nanometers; the particle size of the nano-particles to be detected is about 10 nanometers when the pore size of the sensing nano-pores SNP is about 80 nanometers; and the particle size of the nano-particles to be detected is about 5 nanometers when the pore size of the sensing nano-pores SNP is about 50 nanometers. Furthermore, the number and pore size of the sensing nano-pores SNP and the dummy nano-pores DNP may affect the flowrate of the fluid delivered in the sampling pipe 130. Since the flowrate of the fluid delivered in the sampling pipe 130 is related to the number and the pore size of the dummy nano-pores DNP and the sensing nano-pores SNP, one skilled in the art may properly modify the number and the pore size of the dummy nano-pores DNP and the sensing nano-pores SNP in accordance with the flowrate of the fluid delivered in the sampling pipe 130.

As shown in FIG. 2 and FIG. 3, in the present embodiment, the number of the dummy nano-pores DNP is greater than the number of the sensing nano-pores SNP, for example. In addition, the sensing nano-pores SNP and the dummy nano-pores DNP are arranged in array, for example. However, the number of the dummy nano-pores DNP and the sensing nano-pores SNP fabricated in the substrate SUB is merely for illustration and the present invention is not limited thereto. For example, the particle detector 140 may merely include one sensing nano-pore SNP, at least one dummy nano-pore DNP (i.e. one or a plurality of dummy nano-pores DNP) and one pair of sensing electrodes E that is positioned adjacent to the sensing nano-pore SNP.

In another aspect, the particle detector 140 may include a substrate SUB and at least one pair of sensing electrodes E disposed on the substrate SUB. The substrate SUB may include a plurality of nano-pores, wherein the pore size of the nano-pores is greater than the particle size of the nano-particles, allowing the nano-particles contained in the fluid passing through the nano-pores of the substrate SUB. The at least one pair of sensing electrodes E is positioned adjacent to at least one of the nano-pores. Furthermore, the above-mentioned nano-pores may have substantially identical or different pore sizes. For example, the pore size of the nano-pores may be between about 5 nanometers to about 200 nanometers. In some embodiments, only a portion of the nano-pores (e.g., one nano-pore or more than one nano-pores) fabricated in the substrate SUB are defined as sensing nano-pores SNP and one pair or more than one pairs of sensing electrodes E are disposed in the proximity of the sensing nano-pores SNP correspondingly. In this case, the particle detector may monitor whether nano-particles is contained in the fluid or not. In some alternative embodiments, not shown in the drawings, all of the nano-pores fabricated in the substrate are defined as sensing nano-pores (i.e. no dummy nano-pore is fabricated in the substrate) and each pair of sensing electrodes is disposed in the proximity of one of the sensing nano-pores, respectively. In this case, the particle detector may count nano-particles contained in the fluid.

As illustrated in FIG. 3, the particle detector 140 may further include a plurality of conductive wirings W and a plurality of conductive pads P disposed on the substrate SUB. In some embodiments, the pairs of sensing electrodes E are electrically connected to the control circuit 300 through the conductive wirings W and the conductive pads P on the substrate SUB, for example. In some alternative embodiments, the electrical connection between the pairs of sensing electrodes E and the control circuit 300 may be achieved through other suitable conductive medium, such as anisotropic conductive film (ACF), anisotropic conductive paste (ACP) or the like.

FIGS. 4 through 8 schematically illustrate various detection signals generated from the particle detector in accordance with some embodiments of the present disclosure.

Figure 4:
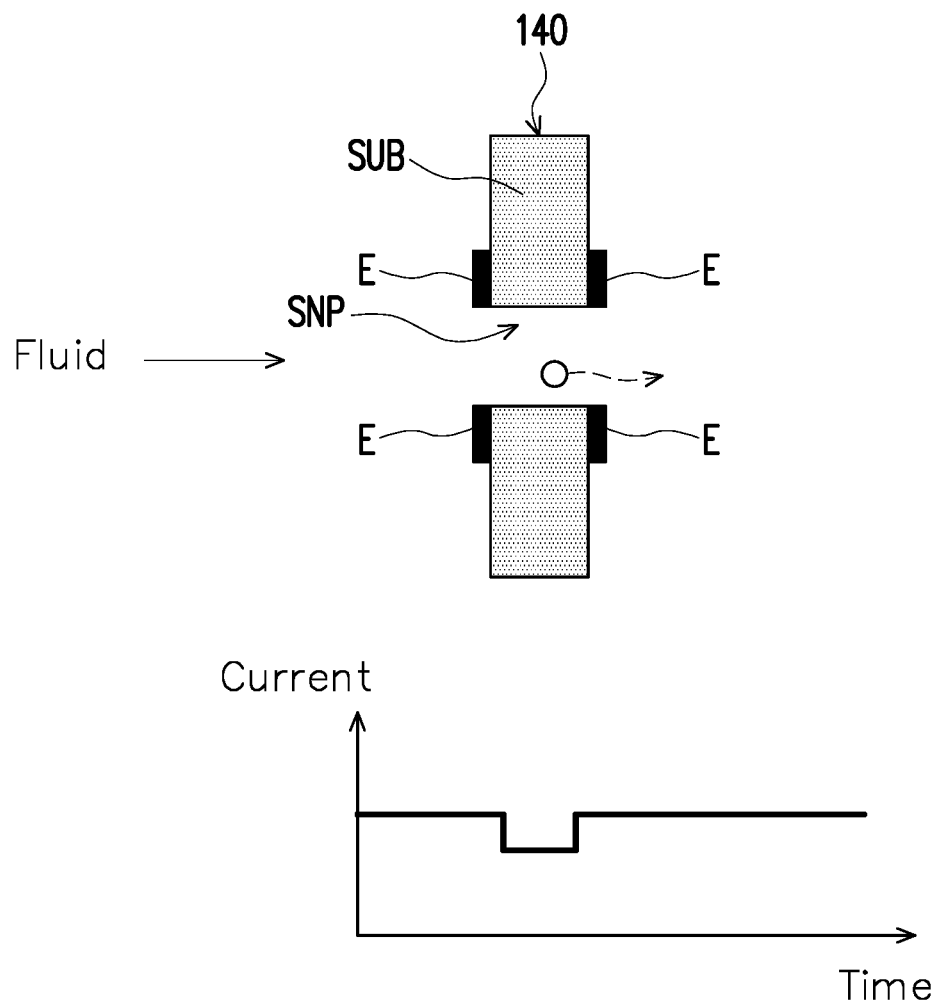
FIGS. 4 through 8 schematically illustrate various detection signals generated from the particle detector in accordance with some embodiments of the present disclosure.

Referring to FIG. 4, in the present embodiment, the sensing electrodes E disposed on the substrate SUB are, for example, electrically connected to an Am-meter (i.e. current meter) in the control circuit 300. When nano-particles contained in the fluid pass through the sensing nano-pores SNP of the substrate SUB, current variation (e.g., the drop in current) may be detected and/or recorded through the sensing electrodes E and the control circuit 300. The amplitude of the detected current variation is relevant to the particle size and the number of the detected nano-particle. Accordingly, through the detected current variation, the particle size and the number of the detected nano-particles may be estimated.

Figure 5:
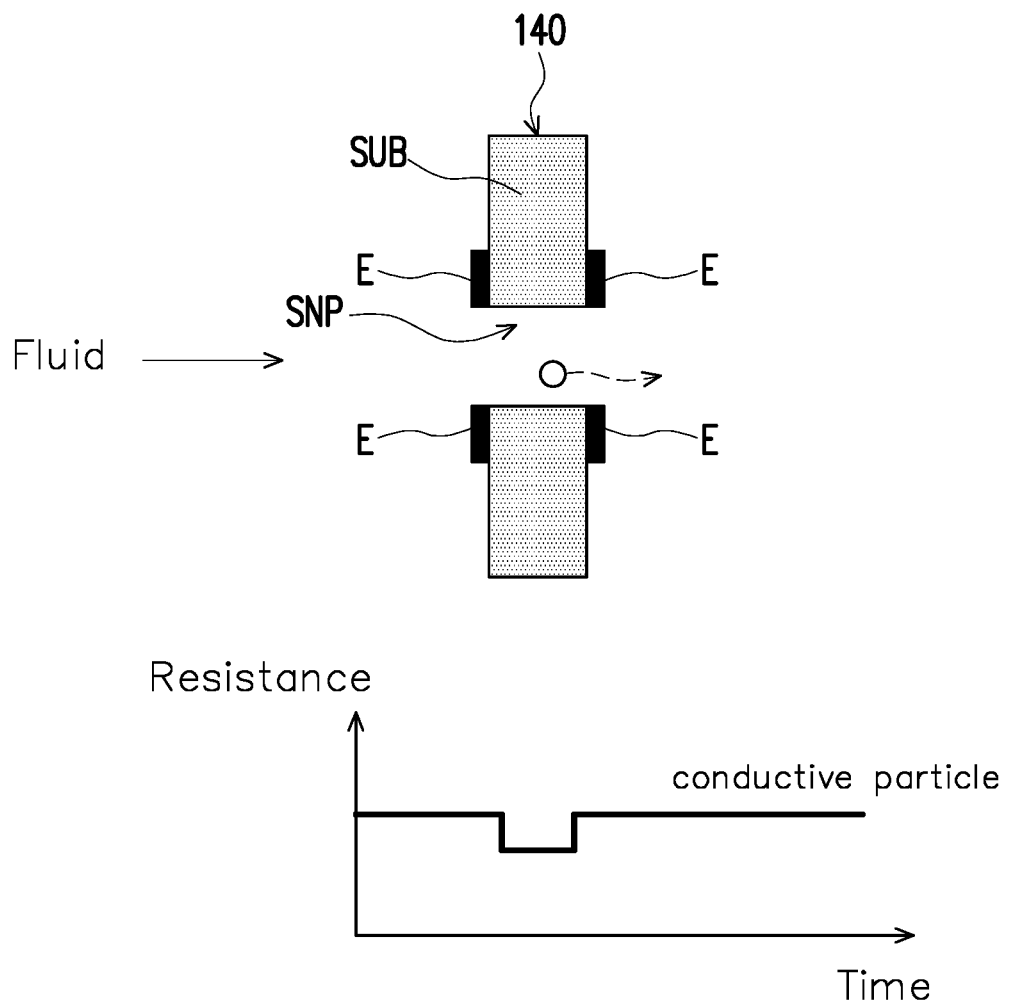
Figure 6:
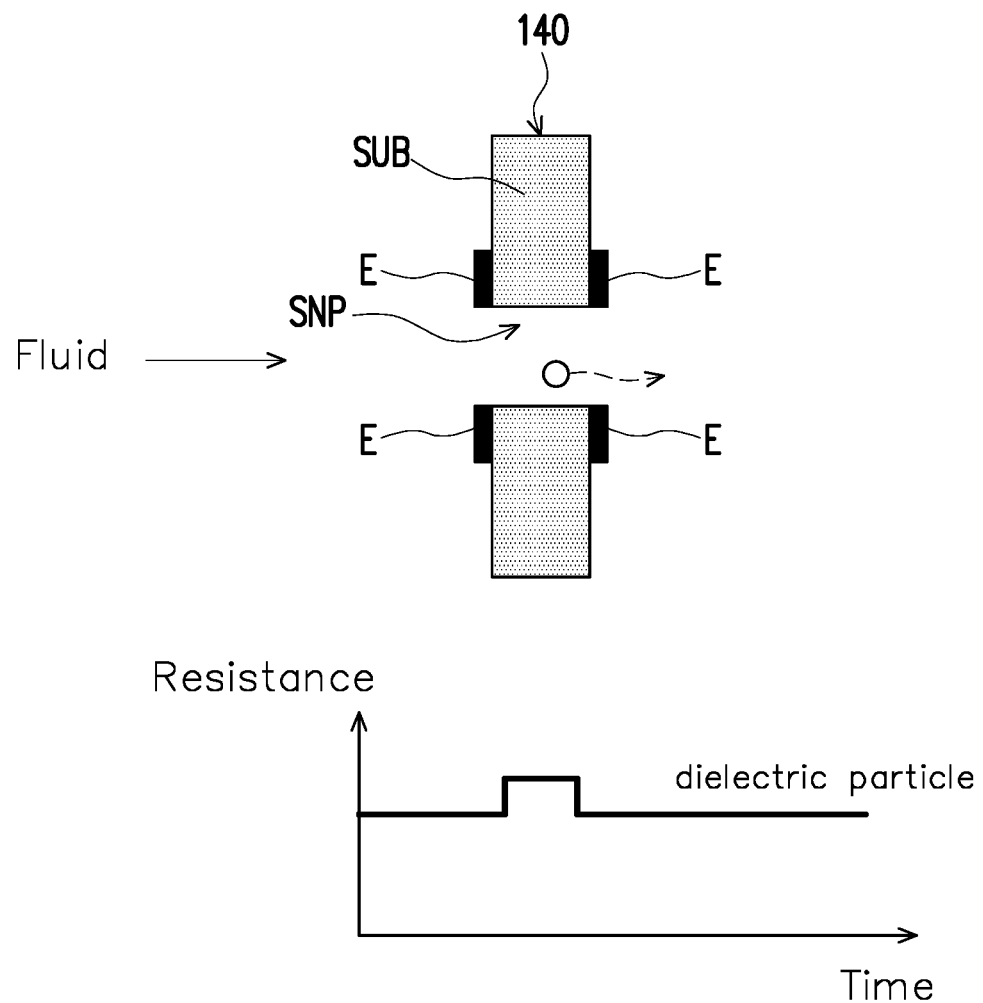

Referring to FIG. 5 and FIG. 6, in the present embodiment, the sensing electrodes E disposed on the substrate SUB are, for example, electrically connected to an Ohm-meter (i.e. resistor meter) in the control circuit 300. When nano-particles contained in the fluid pass through the sensing nano-pores SNP of the substrate SUB, resistance variation may be detected and/or recorded through the sensing electrodes E and the control circuit 300. Through the detected resistance variation, the resistivity of the detected nano-particles may be measured and the ingredient of the detected nano-particles may be essentially identified. As shown in FIG. 5, when resistance drop is detected, the detected nano-particles may be identified as conductive particles. As shown in FIG. 6, when resistance raise is detected, the detected nano-particles may be identified as dielectric or insulating particles.

In some embodiments, the sensing electrodes E disposed on the substrate SUB may be electrically connected to a Volt-Ohm meter (i.e. multi-meter) in the control circuit 300. When nano-particles contained in the fluid pass through the sensing nano-pores SNP of the substrate SUB, current variation and resistance variation may be detected through the sensing electrodes E and the control circuit 300. In this case, through the detected current variation and resistance variation, not only the particle size and the number of the detected nano-particles may be estimated, but also the resistivity of the detected nano-particles may be measured and the ingredient of the detected nano-particles may be essentially identified.

Figure 7:
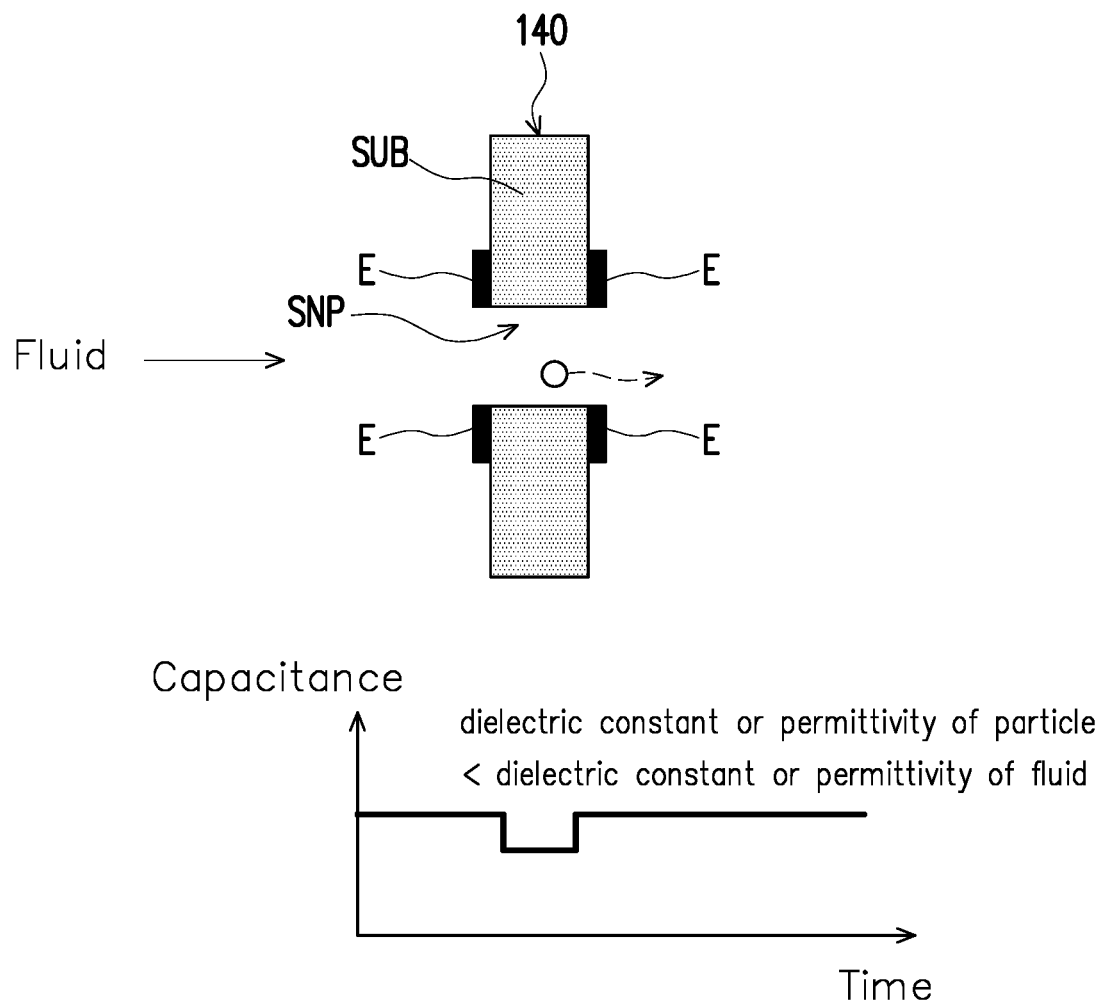
Figure 8:
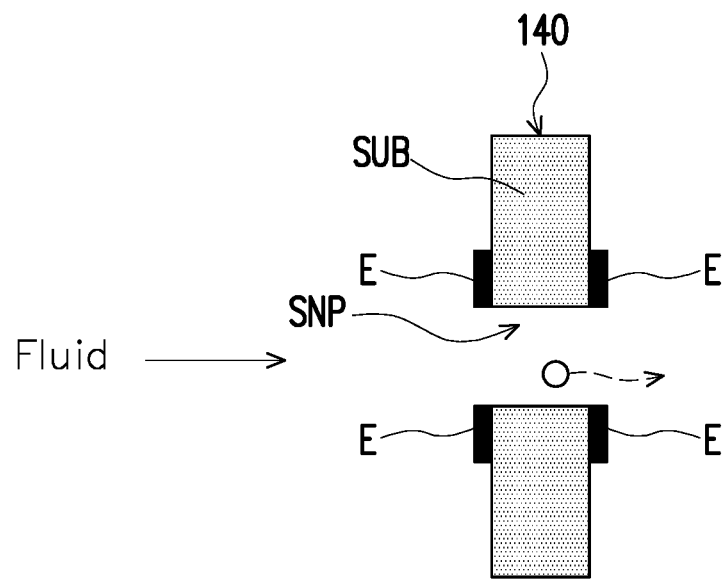
Figure 8:
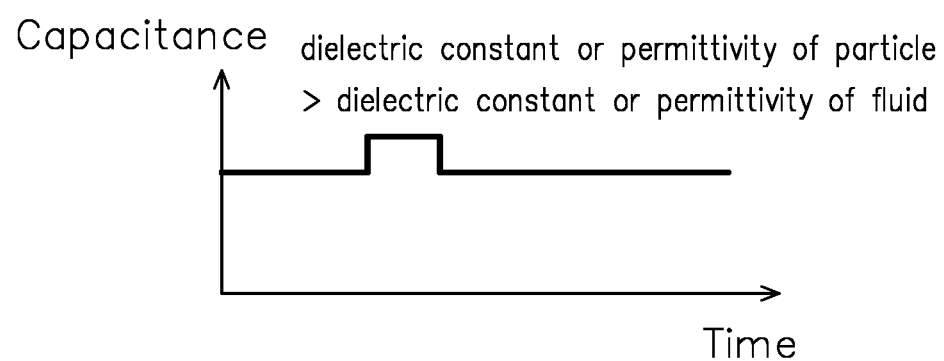

Referring to FIG. 7 and FIG. 8, in the present embodiment, the sensing electrodes E disposed on the substrate SUB are, for example, electrically connected to a capacitance meter in the control circuit 300. When nano-particles contained in the fluid pass through the sensing nano-pores SNP of the substrate SUB, capacitance variation may be detected and/or recorded through the sensing electrodes E and the control circuit 300. Through the detected capacitance variation, the relationship between the dielectric constant of the detected nano-particles and the dielectric constant of the fluid may be identified. Furthermore, through the detected capacitance variation, the relationship between the permittivity of the detected nano-particles and the permittivity of the fluid may be identified. As shown in FIG. 7, when capacitance drop is detected, the dielectric constant and permittivity of the detected nano-particles is smaller than the dielectric constant and permittivity of the fluid. As shown in FIG. 8, when capacitance raise is detected, the dielectric constant and permittivity of the detected nano-particles is greater than the dielectric constant and permittivity of the fluid.

In some alternative embodiments, the sensing electrodes E disposed on the substrate SUB may be electrically connected to a capacitance meter and a Volt-Ohm meter (i.e. multi-meter) in the control circuit 300. When nano-particles contained in the fluid pass through the sensing nano-pores SNP of the substrate SUB, capacitance variation, current variation and resistance variation may be detected through the sensing electrodes E and the control circuit 300. In this case, through the detected capacitance variation, current variation and resistance variation, not only the particle size and the number of the detected nano-particles may be estimated, but also the resistivity of the detected nano-particles may be measured and the ingredient of the detected nano-particles may be identified. Furthermore, the relationship between the dielectric constant of the detected nano-particles and the dielectric constant of the fluid may be identified.

Figure 9:
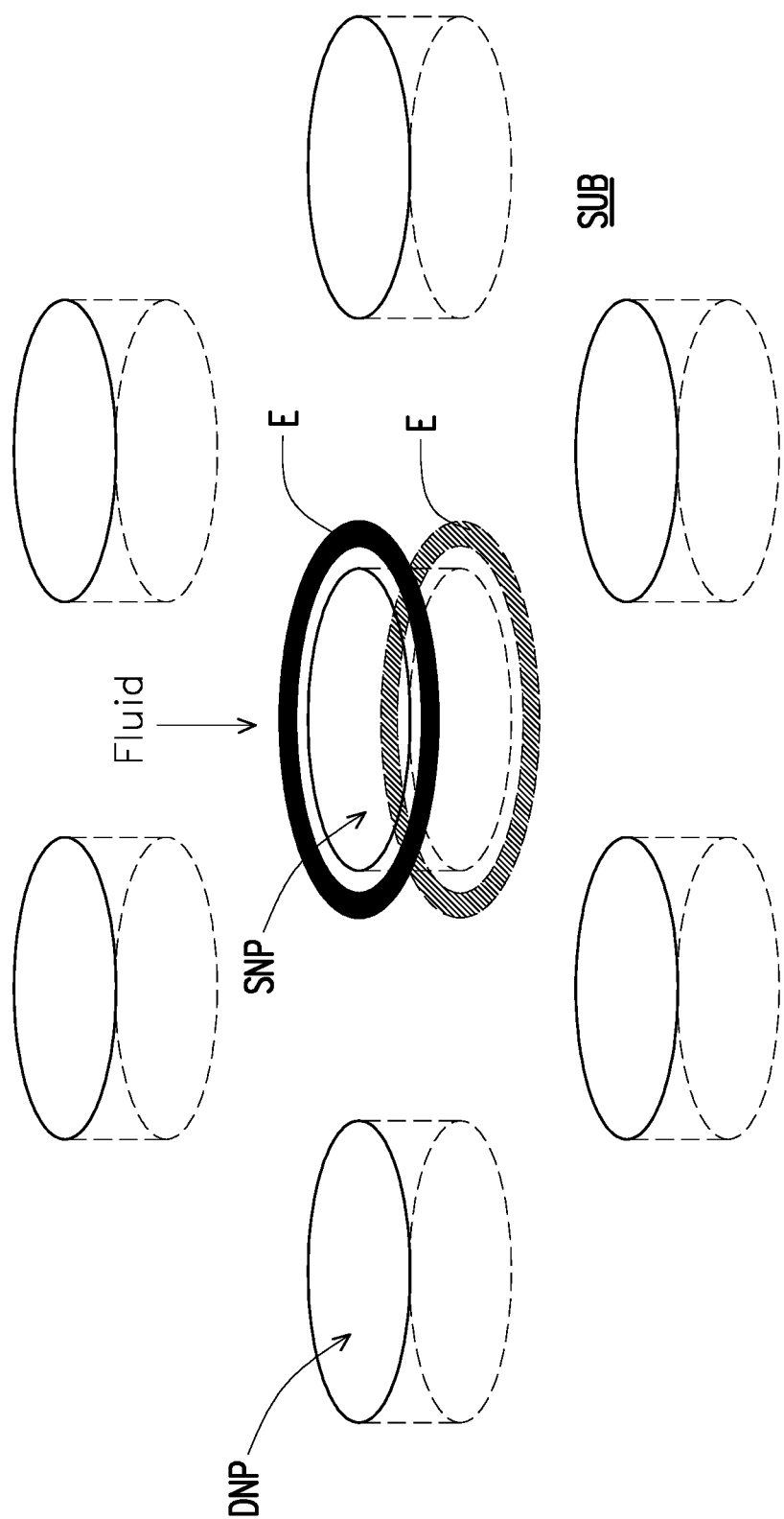
FIG. 9 and FIG. 10 are schematic views respectively illustrating the particle detector having various electrode designs in accordance with various embodiments of the present disclosure.
Figure 10:
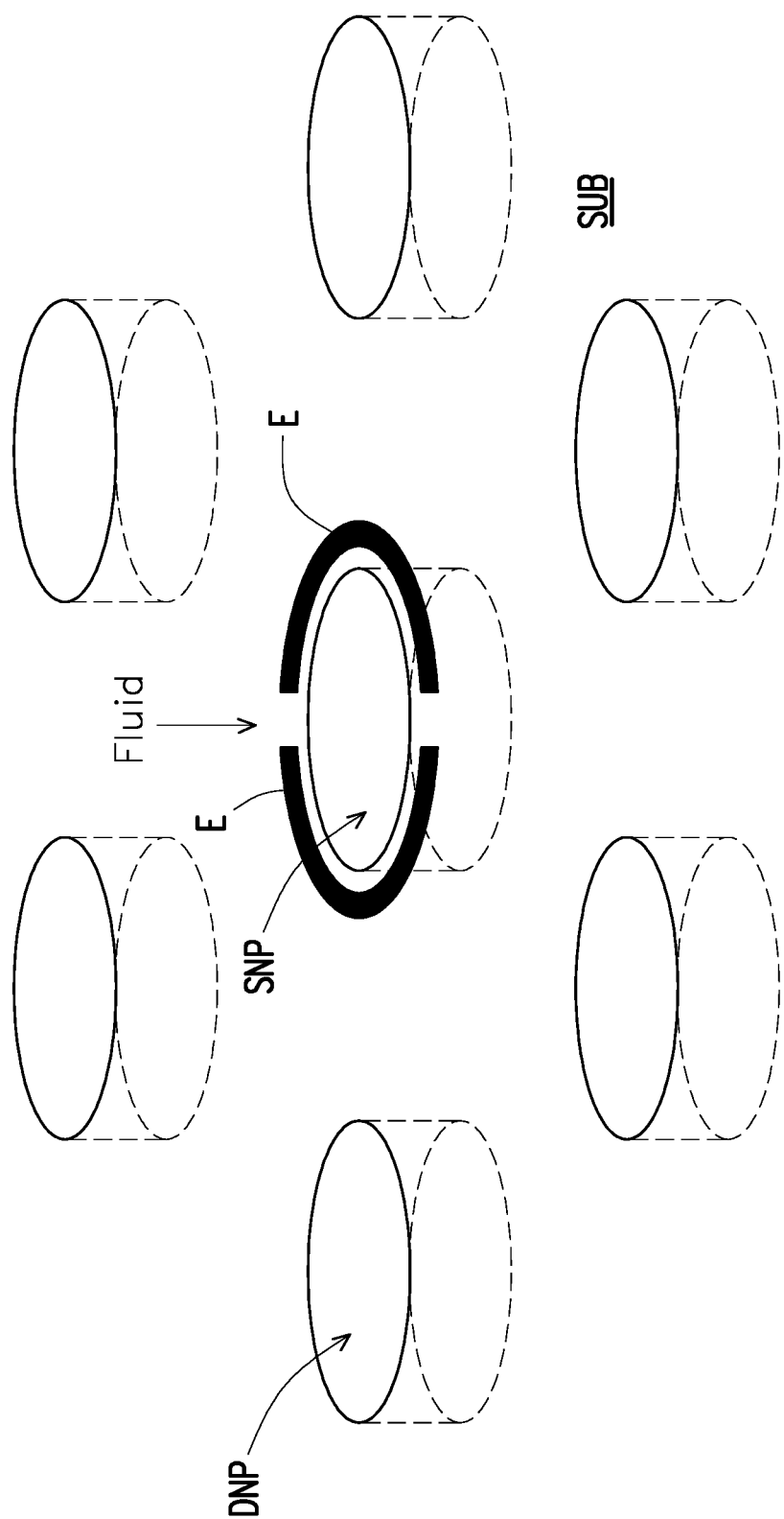

FIG. 9 and FIG. 10 are schematic views respectively illustrating the particle detector having various electrode designs in accordance with various embodiments of the present disclosure.

Referring to FIG. 9, one sensing nano-pore SNP and a plurality of dummy nano-pores DNP formed in the substrate SUB are illustrated. As shown in FIG. 9, a pair of sensing electrodes E are disposed on two opposite sides or surfaces of the substrate SUB, the sensing electrodes E are, for example, ring-shaped electrodes disposed in the proximity of the sensing nano-pore SNP. Furthermore, the sensing nano-pore SNP is surrounded by each ring-shaped sensing electrode E.

Referring to FIG. 10, one sensing nano-pore SNP and a plurality of dummy nano-pores DNP formed in the substrate SUB are illustrated. As shown in FIG. 10, a pair of sensing electrodes E are disposed on the same side or one surface of the substrate SUB, the pair of sensing electrodes E include, for example, two arc-shaped electrodes disposed in the proximity of the sensing nano-pore SNP. Furthermore, the sensing nano-pore SNP is surrounded by the pair of arc-shaped sensing electrodes E.

Figure 11:
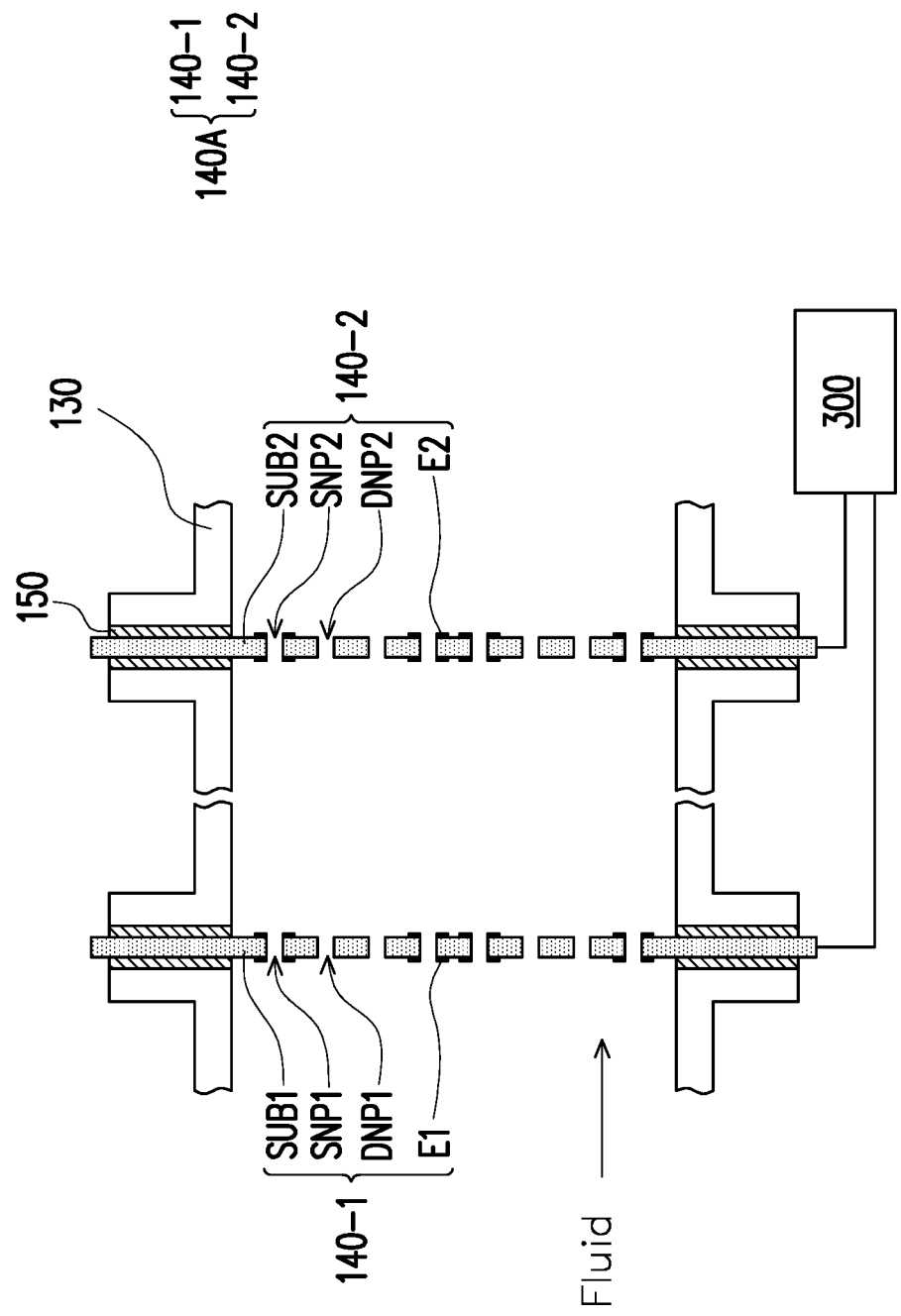
FIG. 11 is a cross-sectional view schematically illustrating the particle detector in accordance with some alternative embodiments of the present disclosure.

FIG. 11 is a cross-sectional view schematically illustrating the particle detector in accordance with some alternative embodiments of the present disclosure.

Referring to FIG. 11, in the present embodiments, a particle detector 140A for detecting nano-particles contained in fluid is illustrated. The particle detector 140A includes a first detector 140-1 and a second detector 140-2 installed in the sampling pipe 130, wherein the first detector 140-1 and the second detector 140-2 are spaced apart from each other. Furthermore, the control circuit 300 is electrically connected to the first detector 140-1 and the second detector 140-2 of the particle detector 140A. The first detector 140-1 of the particle detector 140A may include a first substrate SUB1 and at least one pair of first sensing electrodes E1 disposed on the first substrate SUB1. The first substrate SUB1 includes a plurality of first nano-pores SNP1/DNP1, wherein the pore size of the plurality of first nano-pores SNP1/DNP1 is greater than the particle size of the nano-particles, allowing the nano-particles contained in the fluid passing through the plurality of first nano-pores SNP1/DNP1. The at least one pair of first sensing electrodes E1 are positioned adjacent to at least one of the plurality of first nano-pores SNP1/DNP1. The second detector 140-2 of the particle detector 140A may include a second substrate SUB2 and at least one pair of second sensing electrodes E2 disposed on the second substrate SUB2. The second substrate SUB2 may include a plurality of second nano-pores SNP2/DNP2, the second substrate SUB2 is spaced apart from the first substrate SUB1, wherein the pore size of the plurality of second nano-pores SNP2/DNP2 is greater than the particle size of the nano-particles, allowing the nano-particles contained in the fluid passing through the plurality of second nano-pores SNP2/DNP2. The at least one pair of second sensing electrodes E2 are positioned adjacent to at least one of the plurality of second nano-pores SNP2/DNP2.

The first nano-pores SNP1/DNP1 may include at least one first sensing nano-pore SNP1 and at least one first dummy nano-pore DNP1, and the at least one pair of first sensing electrodes E1 are positioned adjacent to the at least one first sensing nano-pore SNP1. The second nano-pores SNP2/DNP2 may include at least one second sensing nano-pore SNP2 and at least one second dummy nano-pore DNP2, and the at least one pair of second sensing electrodes E2 are positioned adjacent to the at least one second sensing nano-pore SNP2. The number of the first sensing nano-pore SNP1, the first dummy nano-pore DNP1, the second sensing nano-pore SNP2 and the second dummy nano-pore DNP2 is not limited in in the present invention.

As shown in FIG. 11, to facilitate the assembling of the sampling pipe 130 and the particle detector 140A, a plurality of elastic elements 150 may be utilized. For example, four elastic elements 150 are installed on two opposite surfaces of the first detector 140-1 and the second detector 140-2 such that the elastic elements 150, the first detector 140-1 and the second detector 140-2 may be clamped by the sampling pipe 130. In addition, the material of the elastic elements 150 may be rubber or other suitable elastic material. Furthermore, the control circuit 300 may include a Volt-meter (i.e. voltage meter), an Am-meter (i.e. current meter), an Ohm-meter (i.e. resistor meter), a capacitance meter, and/or a Volt-Ohm meter (i.e. multi-meter).

In some embodiments, the first detector 140-1 and the second detector 140-2 may be electrically connected to the same type meter in the control circuit 300. In some alternative embodiments, the first detector 140-1 and the second detector 140-2 may be electrically connected to different types of meters in the control circuit 300.

Figure 12:
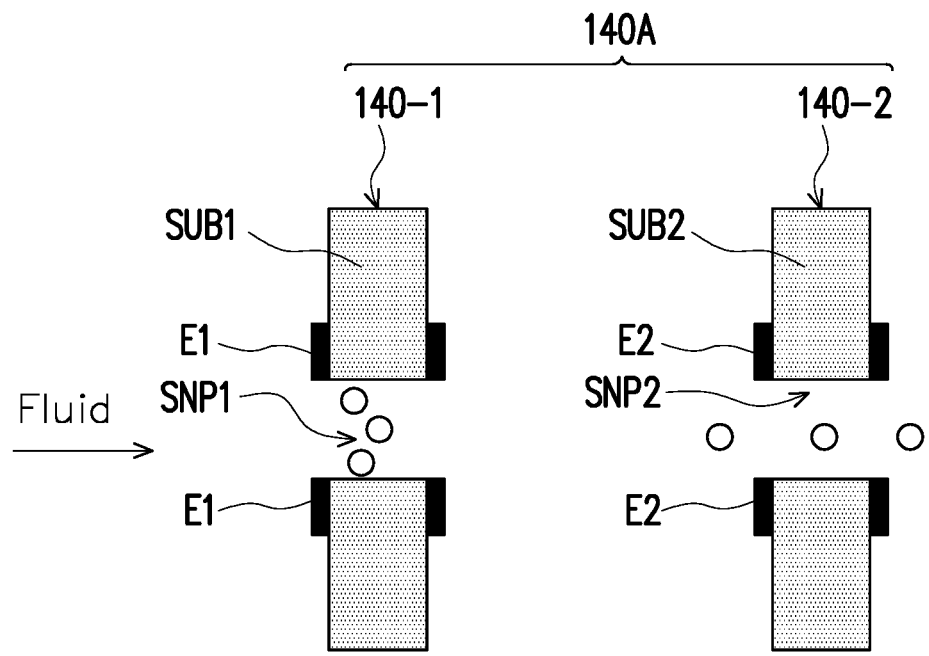
FIG. 12 schematically illustrates detection signal generated from the particle detector in accordance with some alternative embodiments of the present disclosure.
Figure 12:
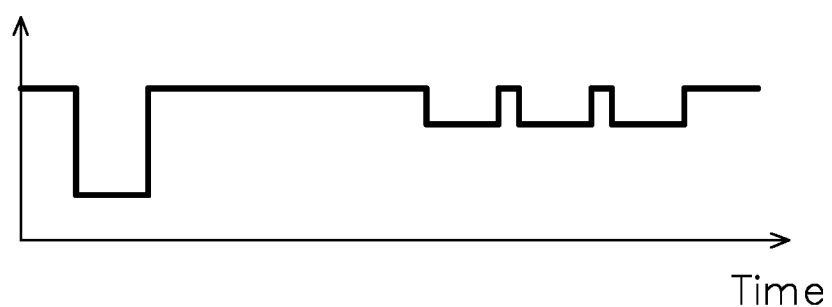

FIG. 12 schematically illustrates detection signal generated from the particle detector in accordance with some alternative embodiments of the present disclosure.

Referring to FIG. 12, the first detector 140-1 and the second detector 140-2 of the particle detector 140A are, for example, electrically connected to a current meter in the control circuit 300. Since nano-particles contained in the fluid may not move in constant speed in turbulent fluid flow, the first detector 140-1 and the second detector 140-2 arranged in series may detect the number and the particle size of the nano-particles with a higher resolution. For example, as shown in FIG. 12, when more than two nano-particles contained in the fluid simultaneously pass through the first sensing nano-pore SNP1 in the first detector 140-1, the detected current variation (e.g., current drop) resulted therefrom may be similar with the detected current variation resulted from one large scaled nano-particle. In this case, the second detector 140-2 may solve such problem because nano-particles contained in the fluid may not move in constant speed in turbulent fluid flow. In other words, one skilled in the art may compare the detected current variations detected by the first detector 140-1 and the second detector 140-2 to estimate the number and the particle size of the nano-particles with a higher resolution.

In some embodiments, the particle detector 140A may be a replaceable component capable of being detached from the sampling pipe 130 easily.

Figure 13:
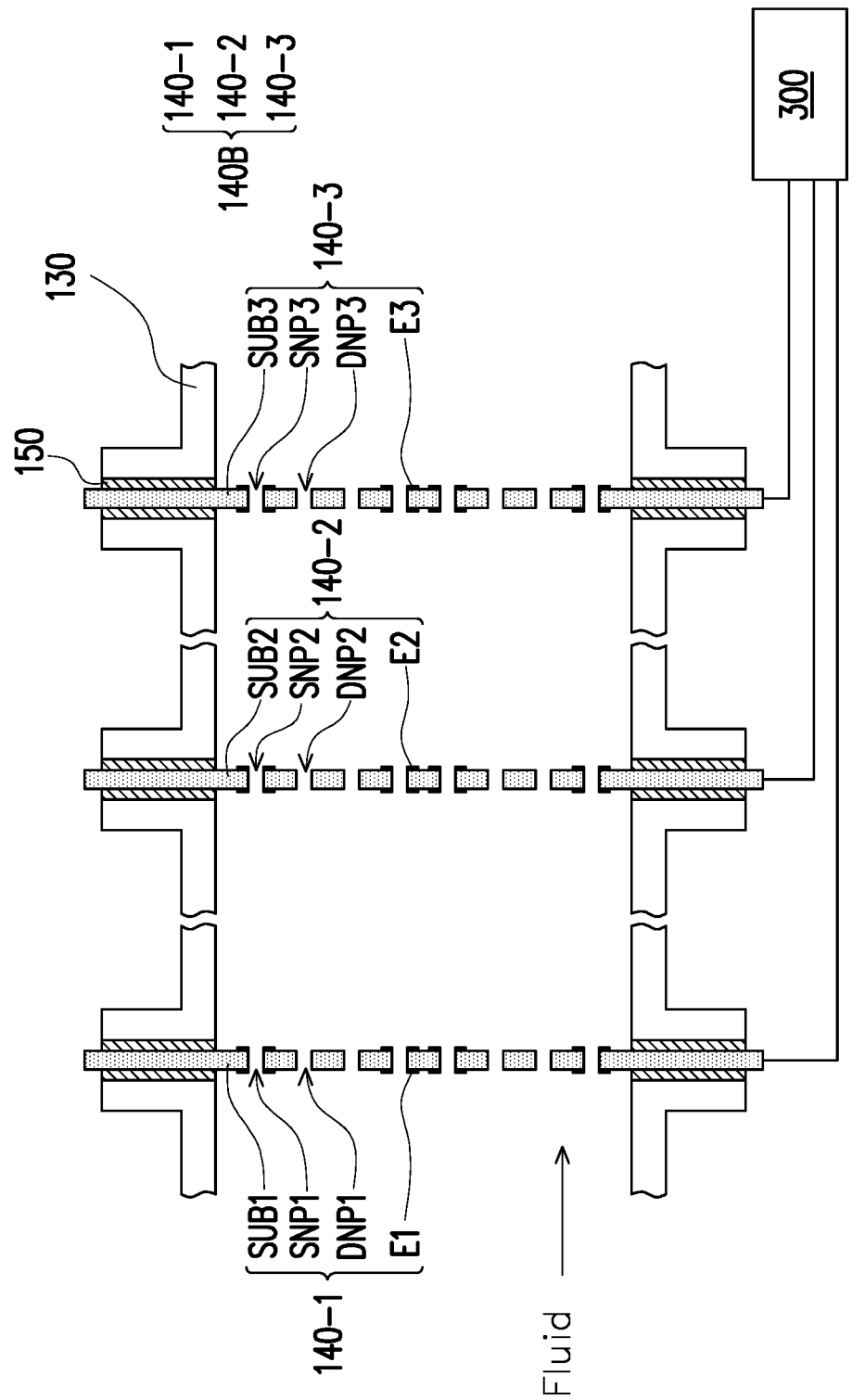
FIG. 13 is a cross-sectional view schematically illustrating the particle detector in accordance with yet some alternative embodiments of the present disclosure.

FIG. 13 is a cross-sectional view schematically illustrating the particle detector in accordance with yet some alternative embodiments of the present disclosure.

Referring to FIG. 13, in the present embodiments, a particle detector 140B for detecting nano-particles contained in fluid is illustrated. The particle detector 140B includes a first detector 140-1, a second detector 140-2 and a third detector 140-3 installed in the sampling pipe 130, wherein the first detector 140-1, the second detector 140-2 and the third detector 140-3 are spaced apart from one other. Furthermore, the control circuit 300 is electrically connected to the first detector 140-1, the second detector 140-2 and the third detector 140-3 of the particle detector 140B. The first detector 140-1 of the particle detector 140B may include a first substrate SUB1 and at least one pair of first sensing electrodes E1 disposed on the first substrate SUB1. The first substrate SUB1 includes a plurality of first nano-pores SNP1/DNP1, wherein the pore size of the plurality of first nano-pores SNP1/DNP1 is greater than the particle size of the nano-particles, allowing the nano-particles contained in the fluid passing through the plurality of first nano-pores SNP1/DNP1. The at least one pair of first sensing electrodes E1 are positioned adjacent to at least one of the plurality of first nano-pores SNP1/DNP1. The second detector 140-2 of the particle detector 140B may include a second substrate SUB2 and at least one pair of second sensing electrodes E2 disposed on the second substrate SUB2. The second substrate SUB2 may include a plurality of second nano-pores SNP2/DNP2, the second substrate SUB2 is spaced apart from the first substrate SUB1, wherein the pore size of the plurality of second nano-pores SNP2/DNP2 is greater than the particle size of the nano-particles, allowing the nano-particles contained in the fluid passing through the plurality of second nano-pores SNP2/DNP2. The at least one pair of second sensing electrodes E2 are positioned adjacent to at least one of the plurality of second nano-pores SNP2/DNP2. The third detector 140-3 of the particle detector 140B may include a third substrate SUB3 and at least one pair of third sensing electrodes E3 disposed on the third substrate SUB3. The third substrate SUB3 may include a plurality of third nano-pores SNP3/DNP3, the third substrate SUB3 is spaced apart from the first substrate SUB1 and the second substrate SUB2, wherein the pore size of the plurality of third nano-pores SNP3/DNP3 is greater than the particle size of the nano-particles, allowing the nano-particles contained in the fluid passing through the plurality of third nano-pores SNP3/DNP3.

The first nano-pores SNP1/DNP1 may include at least one first sensing nano-pore SNP1 and at least one first dummy nano-pore DNP1, and the at least one pair of first sensing electrodes E1 are positioned adjacent to the at least one first sensing nano-pore SNP1. The second nano-pores SNP2/DNP2 may include at least one second sensing nano-pore SNP2 and at least one second dummy nano-pore DNP2, and the at least one pair of second sensing electrodes E2 are positioned adjacent to the at least one second sensing nano-pore SNP2. The third nano-pores SNP3/DNP3 may include at least one third sensing nano-pore SNP3 and at least one third dummy nano-pore DNP3, and the at least one pair of third sensing electrodes E3 are positioned adjacent to the at least one third sensing nano-pore SNP3. The number of the first sensing nano-pore SNP1, the first dummy nano-pore DNP1, the second sensing nano-pore SNP2, the second dummy nano-pore DNP2, the third sensing nano-pore SNP3, the third dummy nano-pore DNP3 is not limited in in the present invention.

As shown in FIG. 13, to facilitate the assembling of the sampling pipe 130 and the particle detector 140B, a plurality of elastic elements 150 may be utilized. For example, six elastic elements 150 are installed on two opposite surfaces of the first detector 140-1, the second detector 140-2 and the third detector 140-3 such that the elastic elements 150, the first detector 140-1, the second detector 140-2 and the third detector 140-3 may be clamped by the sampling pipe 130. In addition, the material of the elastic elements 150 may be rubber or other suitable elastic material. Furthermore, the control circuit 300 may include a Volt-meter (i.e. voltage meter), an Am-meter (i.e. current meter), an Ohm-meter (i.e. resistor meter), a capacitance meter, and/or a Volt-Ohm meter (i.e. multi-meter).

In some embodiments, the first detector 140-1, the second detector 140-2 and the third detector 140-3 may be electrically connected to the same type meter in the control circuit 300. In some alternative embodiments, the first detector 140-1, the second detector 140-2 and the third detector 140-3 may be electrically connected to different types of meters in the control circuit 300.

In some embodiments, the particle detector 140B may be a replaceable component capable of being detached from the sampling pipe 130 easily.

Figure 14:
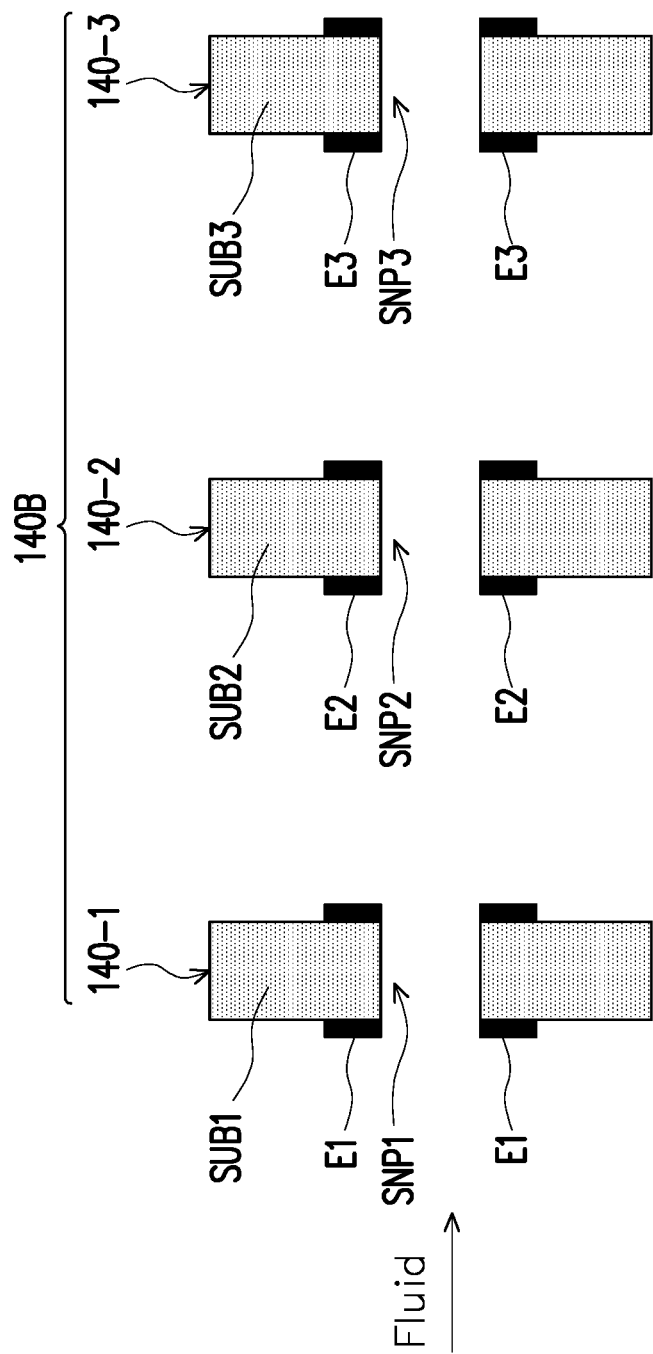
FIG. 14 and FIG. 15 are cross-sectional views schematically illustrating the particle detectors in accordance with various embodiments of the present disclosure.
Figure 15:
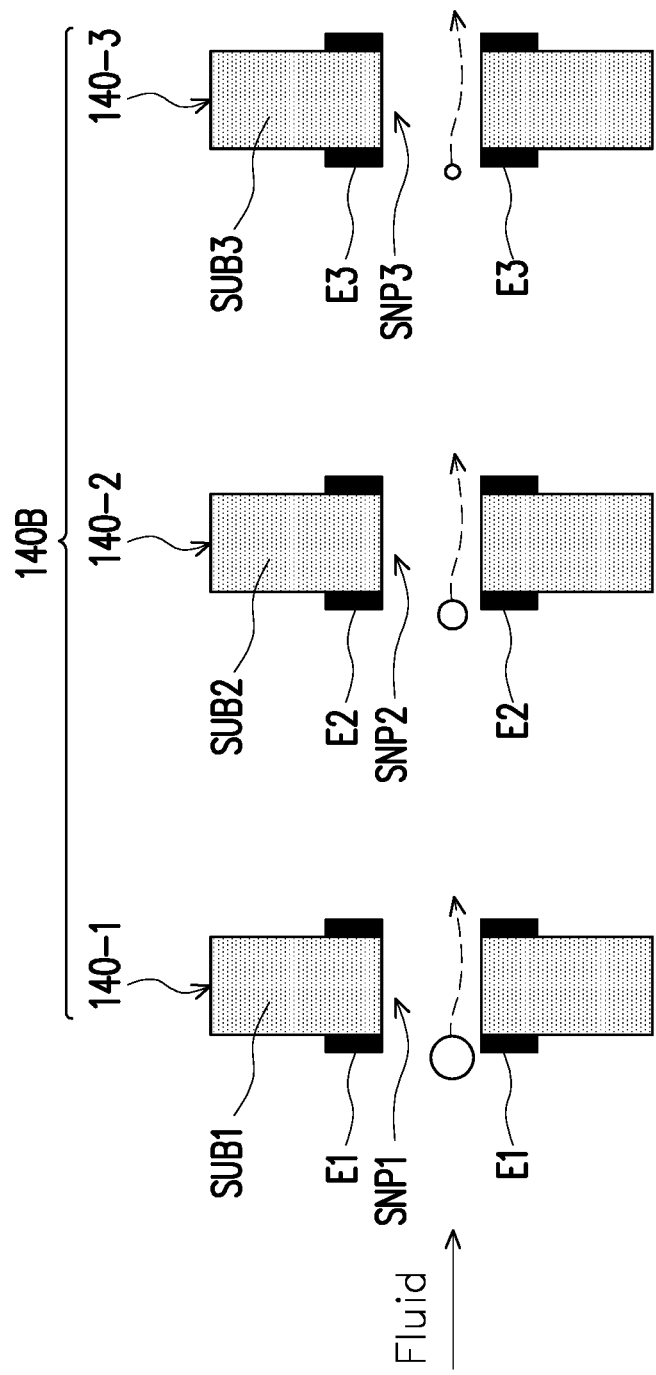

FIG. 14 and FIG. 15 are cross-sectional views schematically illustrating the particle detectors in accordance with various embodiments of the present disclosure. Referring to FIG. 13 through FIG. 15, the pore size of the nano-pores in the he first detector 140-1, the second detector 140-2 and the third detector 140-3 may be substantially identical or different. As shown in FIG. 14, the first nano-pores (e.g., the first sensing nano-pores SNP1), the second nano-pores (e.g., the second sensing nano-pores SNP2) and the third nano-pores (e.g., the third sensing nano-pores SNP3) may be substantially identical in pore size, for example. As shown in FIG. 15, the first nano-pores (e.g., the first sensing nano-pores SNP1), the second nano-pores (e.g., the second sensing nano-pores SNP2) and the third nano-pores (e.g., the third sensing nano-pores SNP3) may have different pore sizes, for example.

Figure 16:
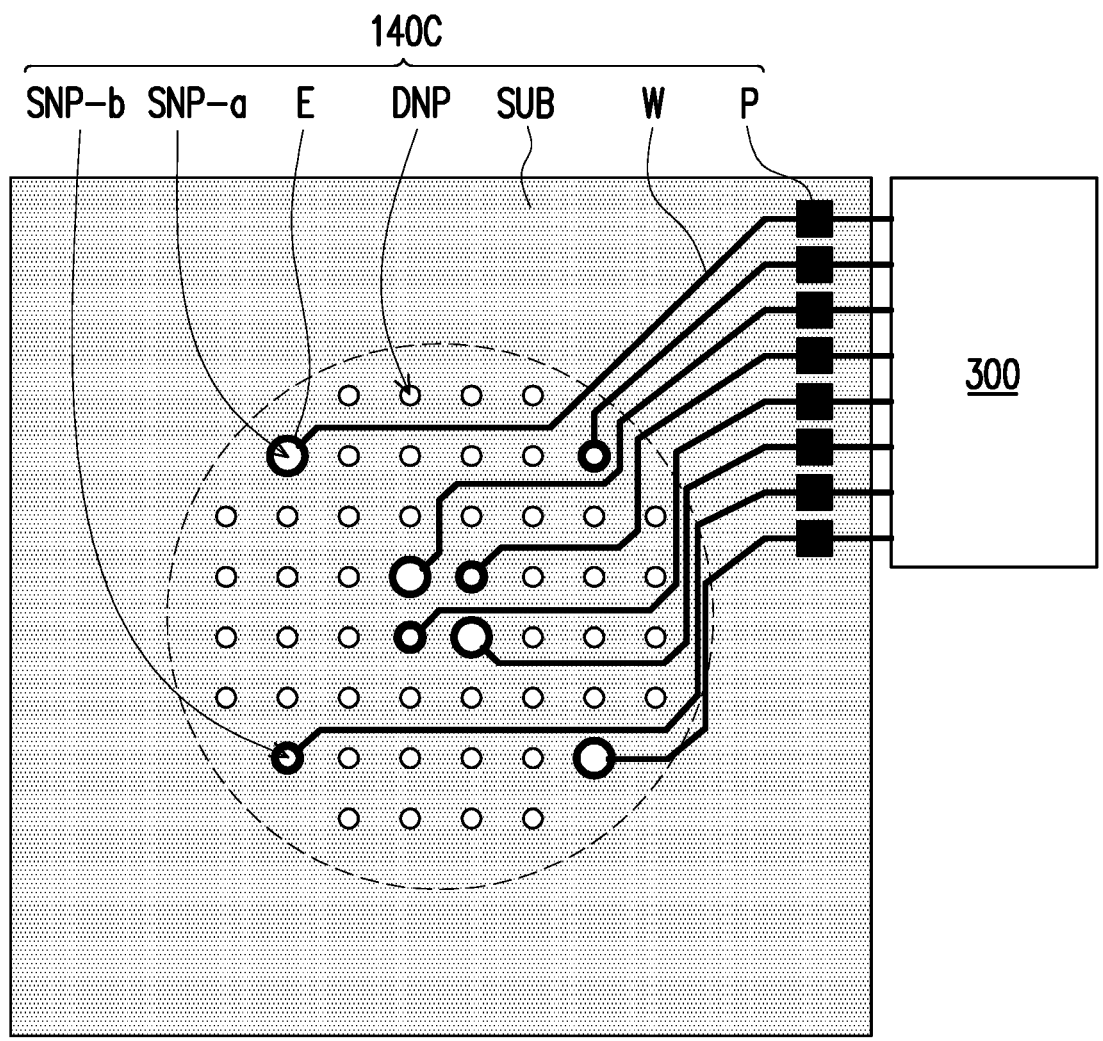
FIG. 16 and FIG. 17 are a plane view and a cross-sectional view of the particle detector in accordance with some alternative embodiments of the present disclosure.
Figure 17:
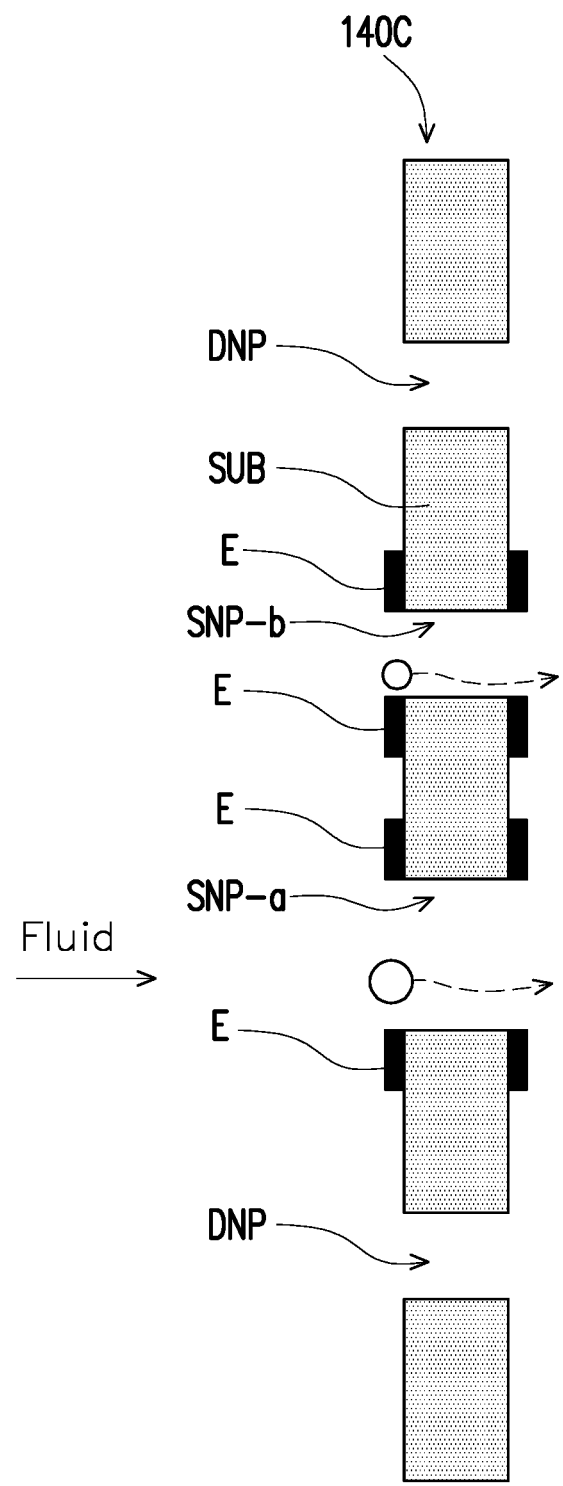

FIG. 16 and FIG. 17 are a plane view and a cross-sectional view of the particle detector in accordance with some alternative embodiments of the present disclosure.

Referring to FIG. 3, FIG. 16 and FIG. 17, in the present embodiments, a particle detector 140C for detecting nano-particles contained in fluid is illustrated. The particle detector 140C is similar with the particle detector 140 (shown in FIG. 3) except for the pore size design of the sensing nano-pores. As shown in FIG. 16 and FIG. 17, the particle detector 140C may include at least one first sensing nano-pore SNP-a and at least one second nano-pore SNP-b, wherein the pore size of the first sensing nano-pores SNP-a is greater than the pore size of the second sensing nano-pores SNP-b. Furthermore, the pore size of the second sensing nano-pores SNP-b may be substantially equal to the pore size of the dummy nano-pores DNP, for example. In the present embodiment, the first sensing nano-pores SNP-a and the second sensing nano-pores SNP-b may be utilized to detect and/or monitor nano-particles having different particle sizes. However, the relationship between the dummy nano-pores DNP, the first sensing nano-pore SNP-a and the second sensing nano-pore SNP-b is not limited in the present invention.

In some embodiments, the first sensing nano-pores SNP-a and the second sensing nano-pores SNP-b of the particle detector 140C may be electrically connected to the same type meter in the control circuit 300. In some alternative embodiments, the first sensing nano-pores SNP-a and the second sensing nano-pores SNP-b of the particle detector 140C may be electrically connected to different types of meters in the control circuit 300.

In some embodiments, the particle detector 140C may be a replaceable component capable of being detached from the sampling pipe 130 easily.

Figure 18:
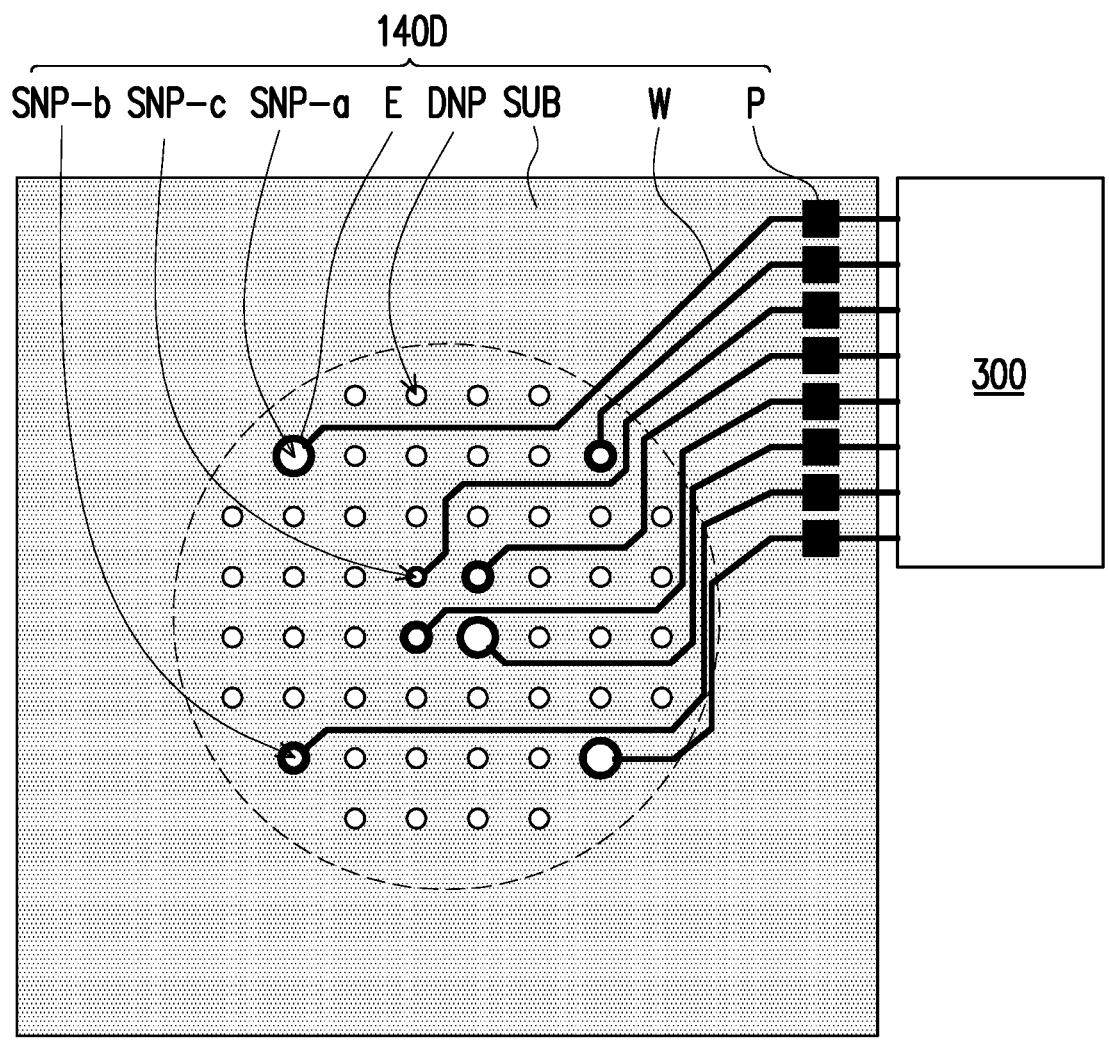
FIG. 18 and FIG. 19 are a plane view and a cross-sectional view of the particle detector in accordance with yet some alternative embodiments of the present disclosure.
Figure 19:
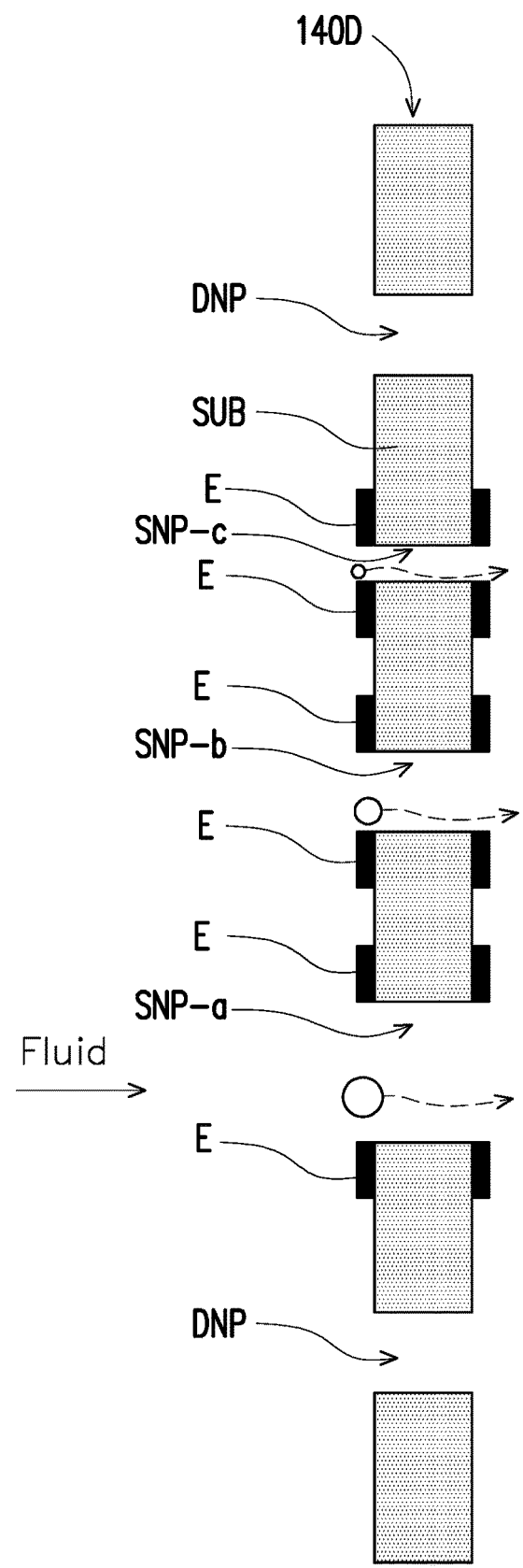

FIG. 18 and FIG. 19 are a plane view and a cross-sectional view of the particle detector in accordance with yet some alternative embodiments of the present disclosure.

Referring to FIG. 3, FIG. 18 and FIG. 19, in the present embodiments, a particle detector 140D for detecting nano-particles contained in fluid is illustrated. The particle detector 140D is similar with the particle detector 140 (shown in FIG. 3) except for the pore size design of the sensing nano-pores. As shown in FIG. 18 and FIG. 19, the particle detector 140D may include at least one first sensing nano-pore SNP-a, at least one second nano-pore SNP-b and at least one third nano-pore SNP-c, wherein the pore size of the first sensing nano-pores SNP-a is greater than the pore size of the second sensing nano-pores SNP-b, and the pore size of the second sensing nano-pores SNP-b is greater than the pore size of the third sensing nano-pores SNP-c. Furthermore, the pore size of the first sensing nano-pores SNP-a and the second sensing nano-pores SNP-b may be substantially equal to the pore size of the dummy nano-pores DNP, and the pore size of the third sensing nano-pores SNP-c may be substantially equal to the pore size of the dummy nano-pores DNP, for example. In the present embodiment, the first sensing nano-pore SNP-a, the second sensing nano-pore SNP-b and the third sensing nano-pore SNP-c may be utilized to detect and/or monitor nano-particles having different particle sizes. However, the relationship between the dummy nano-pores DNP, the first sensing nano-pore SNP-a, the second sensing nano-pore SNP-b and the third sensing nano-pore SNP-c is not limited in the present invention.

In some embodiments, the first sensing nano-pore SNP-a, the second sensing nano-pore SNP-b and the third sensing nano-pore SNP-c of the particle detector 140D may be electrically connected to the same type meter in the control circuit 300. In some alternative embodiments, the first sensing nano-pore SNP-a, the second sensing nano-pore SNP-b and the third sensing nano-pore SNP-c of the particle detector 140D may be electrically connected to different types of meters in the control circuit 300.

In some embodiments, the particle detector 140D may be a replaceable component capable of being detached from the sampling pipe 130 easily.

The nano-pore design of the particle detector 140C and/or the particle detector 140D may be utilized in the architectures illustrated in FIG. 2, FIG. 11 and FIG. 13 in accordance with different requirements.

In accordance with some embodiments of the disclosure, a method for processing a substrate with a fluid flowing through a particle detector is provided. The particle detector includes a substrate and a pair of sensing electrodes in contact with the substrate. The substrate includes nano-pores. The pore size of the nano-pores is greater than the particle size of nano-particles in the fluid, allowing the nano-particles in the fluid passing through the nano-pores. The pair of sensing electrodes are positioned adjacent to a sensing nano-pore among the nano-pores, and the pair of sensing electrodes are not positioned adjacent to a dummy nano-pore among the nano-pores.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
performing a process on a first substrate with a fluid flowing through a particle detector, the particle detector comprising a second substrate and a pair of sensing electrodes in contact with the second substrate, the second substrate comprising nano-pores, a pore size of the nano-pores being greater than a particle size of nano-particles in the fluid, allowing the nano-particles in the fluid passing through the nano-pores, the pair of sensing electrodes being positioned adjacent to a sensing nano-pore among the nano-pores, and the pair of sensing electrodes being not positioned adjacent to a dummy nano-pore among the nano-pores.

2. The method as claimed in claim 1, wherein the process performed on the first substrate comprises a cleaning process, an etching process, a thermal process or an oxidation process.

3. The method as claimed in claim 1, wherein the sensing nano-pore and the dummy nano-pore are substantially identical in pore size.

4. The method as claimed in claim 1, wherein the sensing nano-pore and the dummy nano-pore are different in pore size.

5. The method as claimed in claim 1, wherein the pore size of the sensing nano-pore is between about 5 nanometers to about 200 nanometers, and the pore size of the dummy nano-pore is between about 5 nanometers to about 200 nanometers.

6. The method as claimed in claim 1, wherein the pair of sensing electrodes comprise a pair of arc-shaped electrodes disposed on one side of the second substrate, and the pair of arc-shaped electrodes are positioned adjacent to the sensing nano-pore.

7. The particle detector as claimed in claim 1, wherein the pair of sensing electrodes comprises a pair of ring-shaped electrodes disposed on opposite sides of the second substrate, and the pair of ring-shaped electrodes are positioned adjacent to the sensing nano-pore.

8. A method, comprising:
performing a process on a first substrate with a fluid, nano-particles in the fluid being monitored by a particle detector, the particle detector comprising a second substrate and pairs of sensing electrodes in contact with the second substrate, the second substrate comprising sensing nano-pores and dummy nano-pores, a pore size of the sensing nano-pores and a pore size of the dummy nano-pores being greater than a particle size of nano-particles, allowing the nano-particles passing through the sensing nano-pores and the dummy nano-pores, each pair of sensing electrodes being positioned adjacent to one of the sensing nano-pores respectively, and the pairs of sensing electrodes are not positioned adjacent to a dummy nano-pore among the nano-pores.

9. The method as claimed in claim 8, wherein the process performed on the first substrate comprises a cleaning process, an etching process, a thermal process or an oxidation process.

10. The method as claimed in claim 8, wherein the sensing nano-pores and the dummy nano-pores are substantially identical in pore size.

11. The method as claimed in claim 8, wherein the sensing nano-pores and the dummy nano-pores are different in pore size.

12. The method as claimed in claim 8, wherein the pore size of the sensing nano-pores is between about 5 nanometers to about 200 nanometers, and the pore size of the dummy nano-pores is between about 5 nanometers to about 200 nanometers.

13. The method as claimed in claim 8, wherein the pairs of sensing electrodes comprise pairs of arc-shaped electrodes disposed on one side of the second substrate, and the pairs of arc-shaped electrodes are positioned adjacent to the sensing nano-pores.

14. The method as claimed in claim 8, wherein the pairs of sensing electrodes comprise pairs of ring-shaped electrodes disposed on opposite sides of the second substrate, and the pairs of ring-shaped electrodes are positioned adjacent to the sensing nano-pores.

15. The method as claimed in claim 8, wherein the sensing nano-pores comprises at least one first sensing nano-pore and at least one second nano-pore, and a pore size of the first sensing nano-pore is greater than a pore size of the second sensing nano-pore.

16. The method as claimed in claim 8, wherein the sensing nano-pores comprises at least one first sensing nano-pore, at least one second nano-pore and at least one third sensing nano-pore, a pore size of the first sensing nano-pore is greater than a pore size of the second sensing nano-pore, and a pore size of the second sensing nano-pore is greater than a pore size of the third sensing nano-pore.

17. A method, comprising:
    performing a process on a substrate to be processed with a fluid, nano-particles in the fluid being monitored by a particle detector, and the particle detector comprising:
        a first substrate comprising first nano-pores, wherein a pore size of the first nano-pores is greater than a particle size of the nano-particles, allowing the nano-particles in the fluid passing through the plurality of first nano-pores;
        at least one pair of first sensing electrodes in contact with the first substrate, and the at least one pair of first sensing electrodes being positioned adjacent to at least one of the first nano-pores;
        a second substrate comprising second nano-pores, the second substrate being spaced apart from the first substrate, wherein a pore size of the second nano-pores is greater than the particle size of the nano-particles, allowing the nano-particles in the fluid passing through the second nano-pores; and
        at least one pair of second sensing electrodes disposed on the second substrate, and the at least one pair of second sensing electrodes being positioned adjacent to at least one of the second nano-pores.

18. The method as claimed in claim 17, wherein the first nano-pores comprise at least one first sensing nano-pore and at least one first dummy nano-pore, and the at least one pair of first sensing electrodes are positioned adjacent to the at least one first sensing nano-pore.

19. The method as claimed in claim 17, wherein the second nano-pores comprises at least one second sensing nano-pore and at least one second dummy nano-pore, and the at least one pair of second sensing electrodes are positioned adjacent to the at least one second sensing nano-pore.

20. The method as claimed in claim 17, wherein the particle detector further comprises:
    a third substrate comprising third nano-pores, the third substrate being spaced apart from the first substrate and the second substrate, wherein a pore size of the third nano-pores is greater than the particle size of the nano-particles, allowing the nano-particles in the fluid passing through the plurality of third nano-pores; and
    at least one pair of third sensing electrodes disposed on the third substrate, and the at least one pair of third sensing electrodes being positioned adjacent to at least one of the third nano-pores.

* * * * *